United States Patent
Song et al.

(10) Patent No.: US 7,491,654 B2
(45) Date of Patent: Feb. 17, 2009

(54) METHOD OF FORMING A ZRO₂ THIN FILM USING PLASMA ENHANCED ATOMIC LAYER DEPOSITION AND METHOD OF FABRICATING A CAPACITOR OF A SEMICONDUCTOR MEMORY DEVICE HAVING THE THIN FILM

(75) Inventors: Min-Woo Song, Seongnam-si (KR);
Seok-Jun Won, Seoul (KR);
Weon-Hong Kim, Suwon-si (KR);
Dae-Jin Kwon, Suwon-si (KR);
Jung-Min Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 19 days.

(21) Appl. No.: 11/485,523

(22) Filed: Jul. 13, 2006

(65) Prior Publication Data

US 2007/0026688 A1   Feb. 1, 2007

(30) Foreign Application Priority Data

Jul. 16, 2005   (KR) .................. 10-2005-0064554

(51) Int. Cl.
*H01L 21/20* (2006.01)
*H01L 21/31* (2006.01)
*H01L 21/469* (2006.01)

(52) U.S. Cl. .................. 438/778; 438/396; 438/785

(58) Field of Classification Search .............. 438/287, 438/396, 778–785; 257/E21.008, E21.143, 257/E21.311
See application file for complete search history.

(56) References Cited

U.S. PATENT DOCUMENTS 6,472,337 B1   10/2002   Zhuang et al.

(Continued)

FOREIGN PATENT DOCUMENTS

JP   2006-045083   *   8/2004

(Continued)

OTHER PUBLICATIONS

Yangdo Kim et al. "Characteristics of ZrO2 gate dielectric deposited using Zr t-butoxide and Zr (NEt2)4 precursors by plasma enhanced atomic layer deposition method" Nov. 1, 2002 Journal of Applied Physics, vol. 92, iss. No. 9, pp. 5443-5447.*

(Continued)

*Primary Examiner*—Matthew Smith
*Assistant Examiner*—Walter H Swanson
(74) *Attorney, Agent, or Firm*—Harness, Dickey & Pierce, P.L.C.

(57) ABSTRACT

Example embodiments of the present invention relate to a method of forming a dielectric thin film and a method of fabricating a semiconductor memory device having the same. Other example embodiments of the present invention relate to a method of forming a ZrO₂ thin film and a method of fabricating a capacitor of a semiconductor memory device using the ZrO₂ thin film as a dielectric layer. A method of forming a ZrO₂ thin film may include supplying a zirconium precursor on a substrate maintained at a desired temperature, thereby forming a chemisorption layer of the precursor on the substrate. The zirconium precursor may be a tris(N-ethyl-N-methylamino)(tert-butoxy) zirconium precursor. The substrate having the chemisorption layer of the precursor may be exposed to the plasma atmosphere of oxygen-containing gas for a desired time, thereby forming a Zr oxide layer on the substrate, and a method of fabricating a capacitor of a semiconductor memory device having the ZrO₂ thin film.

20 Claims, 12 Drawing Sheets

U.S. PATENT DOCUMENTS

| | | | |
|---|---|---|---|
| 6,541,073 B1 | 4/2003 | Yao et al. | |
| 7,135,369 B2 * | 11/2006 | Ahn et al. | 438/253 |
| 2004/0023461 A1 * | 2/2004 | Ahn et al. | 438/287 |
| 2004/0043569 A1 * | 3/2004 | Ahn et al. | 438/287 |
| 2004/0082171 A1 * | 4/2004 | Shin et al. | 438/689 |
| 2004/0217410 A1 * | 11/2004 | Meng et al. | 257/310 |
| 2005/0009372 A1 * | 1/2005 | Marsh | 438/785 |
| 2005/0064236 A1 * | 3/2005 | Lim et al. | 428/690 |
| 2005/0227442 A1 * | 10/2005 | Ahn et al. | 438/287 |
| 2005/0277223 A1 * | 12/2005 | Lee et al. | 438/100 |
| 2006/0014398 A1 * | 1/2006 | Song et al. | 438/778 |
| 2007/0004224 A1 * | 1/2007 | Currie | 438/778 |

FOREIGN PATENT DOCUMENTS

| | | |
|---|---|---|
| KR | 1020040068027 A | 7/2004 |
| KR | 1020040074754 A | 8/2004 |

OTHER PUBLICATIONS

L. Niinisto et al. "Advanced electronic and optoelectronic materials by Atomic Layer Deposition: An overview with special emphasis on recent progress in processing of high-k dielectrics and other oxide materials" May 11, 2004 Physica Status Solidi (a), vol. 201, iss. No. 7, pp. 1443-1452.*

* cited by examiner

METHOD OF FORMING A ZRO₂ THIN FILM USING PLASMA ENHANCED ATOMIC LAYER DEPOSITION AND METHOD OF FABRICATING A CAPACITOR OF A SEMICONDUCTOR MEMORY DEVICE HAVING THE THIN FILM

PRIORITY STATEMENT

This application claims priority under 35 U.S.C. § 119 to Korean Patent Application No. 10-2005-0064554, filed on Jul. 16, 2005, in the Korean Intellectual Property Office (KIPO), the entire contents of which are incorporated herein by reference.

BACKGROUND

1. Field

Example embodiments of the present invention relate to a method of forming a dielectric thin film and a method of fabricating a semiconductor memory device having the same. Other example embodiments of the present invention relate to a method of forming a $ZrO_2$ thin film and a method of fabricating a capacitor of a semiconductor memory device using the $ZrO_2$ thin film as a dielectric layer.

2. Description of the Related Art

Highly integrated semiconductor memory devices may have a reduced design rule and an area may also be reduced that is occupied by a unit memory cell of the semiconductor memory device. An area may be reduced that is occupied by a capacitor used in a memory cell of a dynamic random access memory (DRAM) device, but the capacitor may still be required to have enough capacitance to provide data input/output characteristics and/or reproducing characteristics, which are typically allowable. Reduction of process margins and spaces may have influenced the design of the capacitor of the memory cell. In order to fabricate a capacitor having a reduced capacitance in a reduced space, various capacitor lower electrode structures, having a relatively high height in a three-dimensional structure, have been proposed.

Various technologies have been developed in order to increase a capacitance in a unit area of a capacitor. In the conventional art, a metal-insulator-semiconductor (MIS) capacitor structure, using a $SiO_2$ dielectric layer, may be used to ensure reduced capacitance by reducing the thickness of the dielectric layer or increasing an effective area in a three-dimensional structure. Because the MIS structure using a $SiO_2$ dielectric layer has reached procedural limitations with increased integration of the device, new technology may need to be developed. An MIM capacitor that uses a metal (e.g., TiN and/or Pt) as an electrode may need a higher work function in order to overcome the limitations of the MIS capacitor. The MIM capacitor may use metal oxide as a dielectric layer, which may be achieved from the metal having a higher oxygen affinity. A conventional metal oxide, used as the dielectric layer, of the MIM capacitor may be $HfO_2$. $HfO_2$, as a high-k material, has a relatively high permittivity of about 20-25 and a relatively wide band gap. $HfO_2$ may ensure higher reliability and higher process stability as compared to other high-k dielectric layers. $HfO_2$ may also be a dielectric layer material for a next-generation DRAM capacitor.

$HfO_2$ may be crystallized at a temperature of about 450° C., which may cause deterioration of leakage current characteristics. A composite layer composed of a $HfO_2/Al_2O_3/HfO_2$ (HAH) stack structure, or a $Hf_xAl_yO_z$ composite layer formed by alternately and repeatedly stacking a $HfO_2$ layer and an $Al_2O_3$ layer, has been studied as an alternative solution to the local defect caused by crystallization of $HfO_2$. These layers may have about 12 Å of an equivalent oxide thickness (EOT) satisfying the condition of about 1 fA/cell based on about 1 V of leakage current. These layers may not be employed for a next generation memory device (e.g., 60 nm of dynamic random access memory (DRAM) or merging DRAM with logic (MDL)), which may require an EOT less than about 10 Å.

SUMMARY

Example embodiments of the present invention relate to a method of forming a dielectric thin film and a method of fabricating a semiconductor memory device having the same. Other example embodiments of the present invention relate to a method of forming a $ZrO_2$ thin film and a method of fabricating a capacitor of a semiconductor memory device using the $ZrO_2$ thin film as a dielectric layer.

In example embodiments of the present invention, a method of forming a $ZrO_2$ thin film may be formed at a higher deposition speed to improve productivity and may be employed as a capacitor dielectric layer of a semiconductor device to provide improved electrical characteristics. In other example embodiments of the present invention, a method of fabricating a capacitor of a semiconductor memory device may employ a dielectric layer having improved thermal characteristics and/or electrical characteristics. The method of fabricating a capacitor of a semiconductor memory device may still keep leakage current characteristics stable to increase (if not maximize) a capacitance.

According to other example embodiments of the present invention, a method of forming a $ZrO_2$ thin film may include supplying a zirconium precursor on a substrate maintained at a desired temperature, thereby forming a chemisorption layer of the precursor on the substrate. The zirconium precursor may be a tris(N-ethyl-N-methylamino)(tert-butoxy) zirconium precursor. The substrate having the chemisorption layer of the precursor may be exposed to the plasma atmosphere of oxygen-containing gas for a desired time, and thereby may form a Zr oxide layer on the substrate. Before exposing the substrate to the plasma atmosphere of the oxygen-containing gas, the method may further include exposing the substrate with the chemisorption layer of the precursor to the oxidation atmosphere without generation of plasma for a desired time.

According to other example embodiments of the present invention, a method of fabricating a capacitor of a semiconductor memory device may include forming a lower electrode on a semiconductor substrate. A dielectric layer including a $ZrO_2$ thin film may be formed on the lower electrode using a plasma enhanced atomic layer deposition (PEALD) process and/or any other suitable process. An upper electrode may be formed on the dielectric layer. The lower electrode and the upper electrode may be composed of a metal nitride, a noble metal and/or any other metal. While the $ZrO_2$ thin film is formed, the semiconductor substrate may be maintained at a temperature of about 100° C.-about 550° C. The semiconductor substrate may be exposed to the plasma atmosphere of the oxygen-containing gas for about 0.1 about 10 seconds. The dielectric layer may be composed of a double layer or a triple layer, in which a $ZrO_2$ thin film and at least one thin film of an $Al_2O_3$ thin film and a $HfO_2$ thin film are sequentially stacked. The dielectric layer may be composed of a layer structure in which a $ZrO_2$ thin film and an $Al_2O_3$ thin film or $HfO_2$ thin film are alternately stacked by about 1-about 3 atomic layers.

According to example embodiments of the present invention, a $ZrO_2$ thin film, having improved electrical characteristics, may be formed with a higher deposition speed and/or a shorter deposition cycle time. By employing the $ZrO_2$ thin film as a capacitor dielectric layer of a semiconductor device, a capacitor may be fabricated with an increased (if not maximized) capacitance, while its leakage current characteristics may be maintained.

BRIEF DESCRIPTION OF THE DRAWINGS

Example embodiments of the present invention will be more clearly understood from the following detailed description taken in conjunction with the accompanying drawings. FIGS. 1-13 represent non-limiting, example embodiments of the present invention as described herein.

DETAILED DESCRIPTION OF THE EXAMPLE EMBODIMENTS

Various example embodiments of the present invention will now be described more fully with reference to the accompanying drawings, in which some example embodiments of the invention are shown. This invention may, however, be embodied in many alternate forms and should not be construed as being limited to only the embodiments set forth herein. Rather, these embodiments are provided so that this disclosure will be thorough and complete, and will fully convey the scope of the invention to those skilled in the art. Like numbers refer to like elements throughout the specification. In the drawings, the thicknesses of layers and regions are exaggerated for clarity.

As used herein, the term "and/or" includes any and all combinations of one or more of the associated listed items. It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which this present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention relate to a method of forming a dielectric thin film and a method of fabricating a semiconductor memory device having the same.

Other example embodiments of the present invention relate to a method of forming a $ZrO_2$ thin film and a method of fabricating a capacitor of a semiconductor memory device using the $ZrO_2$ thin film as a dielectric layer.

A $ZrO_2$ thin film may have a higher dielectric constant (about 25 or higher), a wider band gap (about 5.8 eV), and improved thermal and/or electrical characteristics. Precursors used to form the $ZrO_2$ thin film may include $ZrCl_2$, zirconium tetra-tert-butoxide (ZTTB), tetrakis (diethylamino) zirconium (TDEAZ), tetrakis (ethylmethylamino) zirconium (TEMAZ), and/or any other suitable precursor. Because the precursors have different process windows, the respective $ZrO_2$ thin films formed from the precursors may also have different layer characteristics. A desired precursor capable of providing thermal stability and the vapor pressure required in accordance with processes may be important.

A precursor used to form the $ZrO_2$ thin film in example embodiments of the present invention may be tris (N-ethyl-N-methylamino) (tert-butoxy) zirconium (hereinafter, referred to as "NOZ-31"). A structural formula of the NOZ-31 is illustrated in Formula 1 as follows.

[Formula 1]

Figure 1:
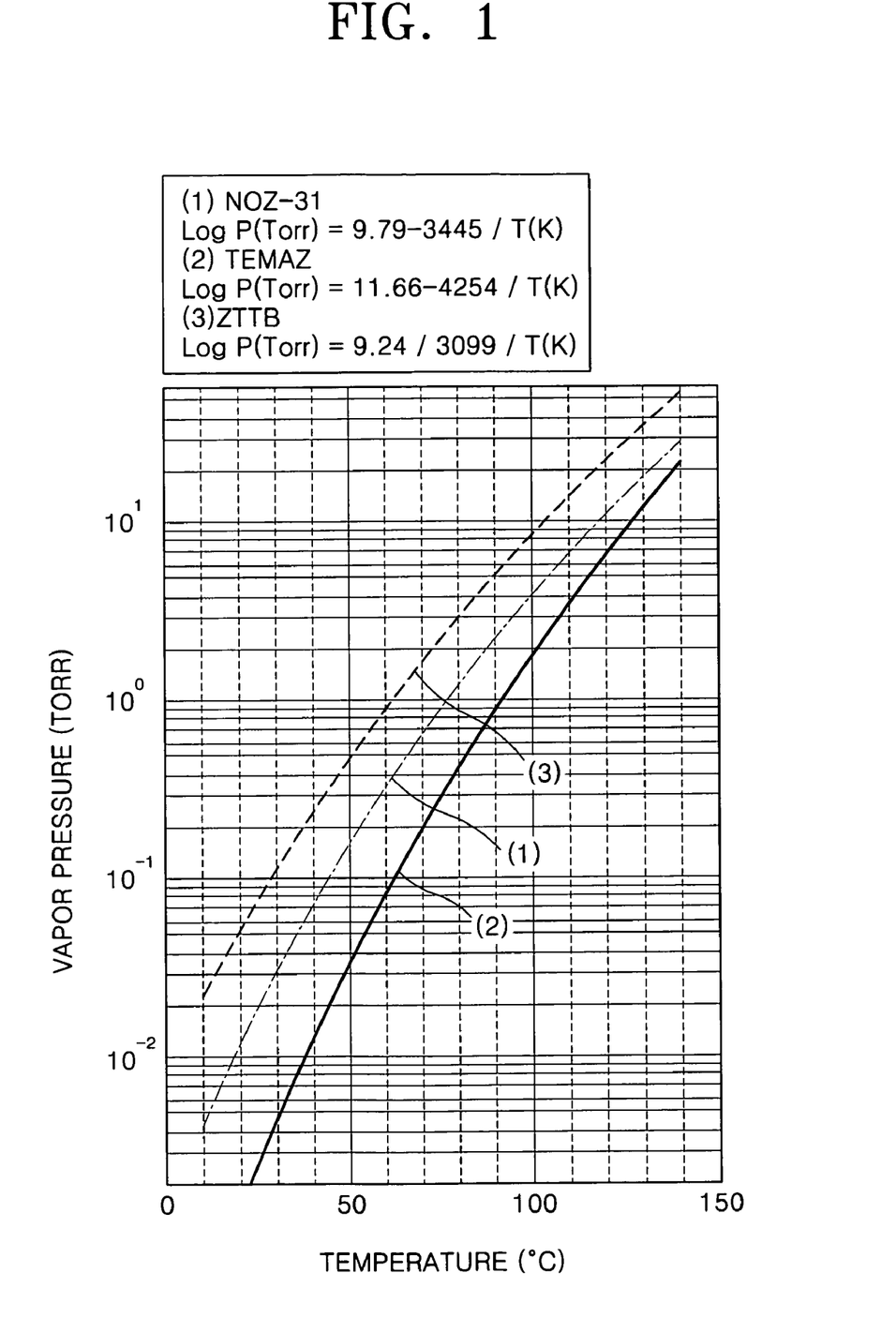
FIG. 1 is a graph illustrating vapor pressure curves of conventional precursors and precursors used in a method of forming a $ZrO_2$ thin film according to example embodiments of the present invention.

FIG. 1 is a graph illustrating vapor pressure curves of conventional precursors and precursors used in a method of forming a $ZrO_2$ thin film according to example embodiments of the present invention.

As illustrated in the vapor pressure curve of FIG. 1, the precursor NOZ-31 may have about 1 torr of vapor pressure at a temperature of about 72° C. These characteristics of NOZ-31 may be higher than that of the precursor TEMAZ. The temperature of the bottle in which precursor NOZ-31 is stored may be maintained relatively low, before it is supplied for a process. If a $ZrO_2$ thin film may be formed on a substrate having a higher aspect ratio, the $ZrO_2$ thin film may be formed with improved step coverage characteristics.

Figure 2:
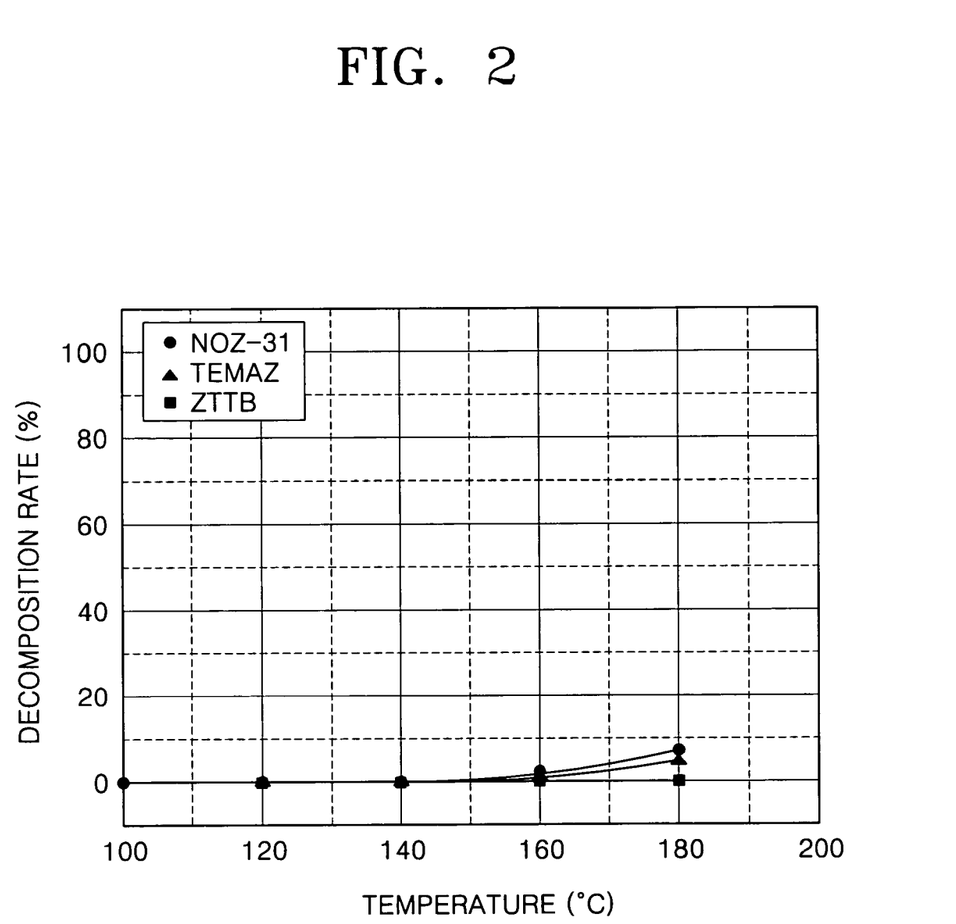
FIG. 2 is a graph illustrating measurement results of thermogravimetric differential thermal analyzer (TG-DTA) showing thermal decomposition characteristics of conventional precursors and precursors used in a method of forming a $ZrO_2$ thin film according to example embodiments of the present invention.

FIG. 2 is a graph illustrating measurement results of thermogravimetric differential thermal analyzer (TG-DTA) showing thermal decomposition characteristics of conventional precursors and precursors used in a method of forming a $ZrO_2$ thin film according to example embodiments of the present invention.

From the thermal decomposition characteristics illustrated in FIG. 2, because TEMAZ and NOZ-31 are thermally decomposed at a temperature of about 160° C., they may have similar thermal stability characteristics. Because the alkoxide group of ZTTB has higher vapor pressure but lower reactivity, it may have a lower deposition speed. Because ZTTB reacts with vapor or moisture sensitively, ZTTB may have a particle generation that increases. Because NOZ-31 may be used as a precursor to form the $ZrO_2$ thin film that has stable reaction characteristics in an atomic layer deposition (ALD) process (e.g., a plasma enhanced ALD (PEALD) process), there is less of a possibility that particles will be generated in the case of the precursor NOZ-31. Because the $ZrO_2$ thin film may be formed at a higher deposition speed using NOZ-31 as a precursor by a PEALD process, according to example embodiments of the present invention, a low throughput problem, which was troubled in an ALD process, may be solved.

Figure 3:
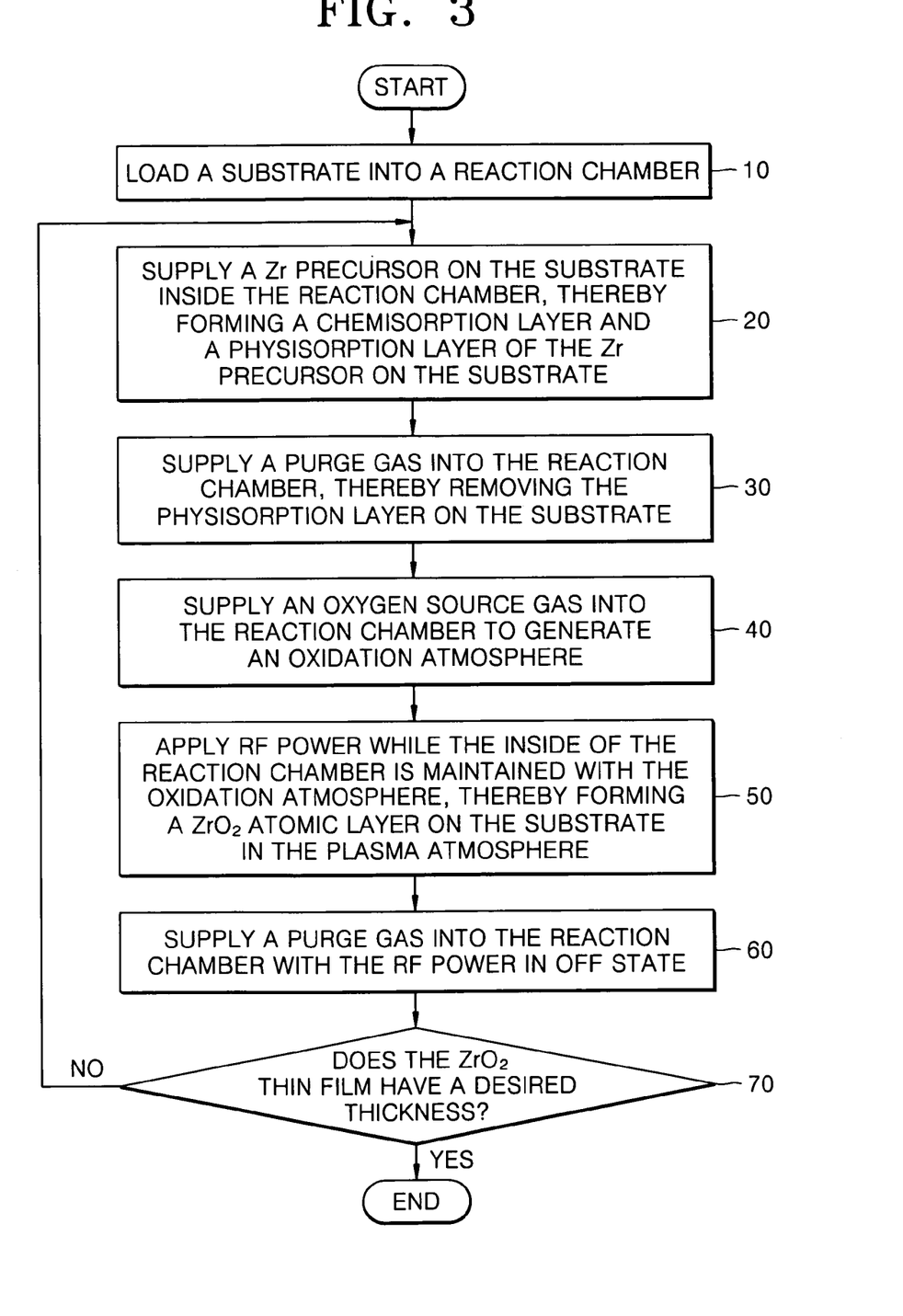
FIG. 3 is a flow chart illustrating a method of forming a $ZrO_2$ thin film according to example embodiments of the present invention.

FIG. 3 is a flow chart illustrating a method of forming a $ZrO_2$ thin film according to example embodiments of the present invention.

Figure 4:
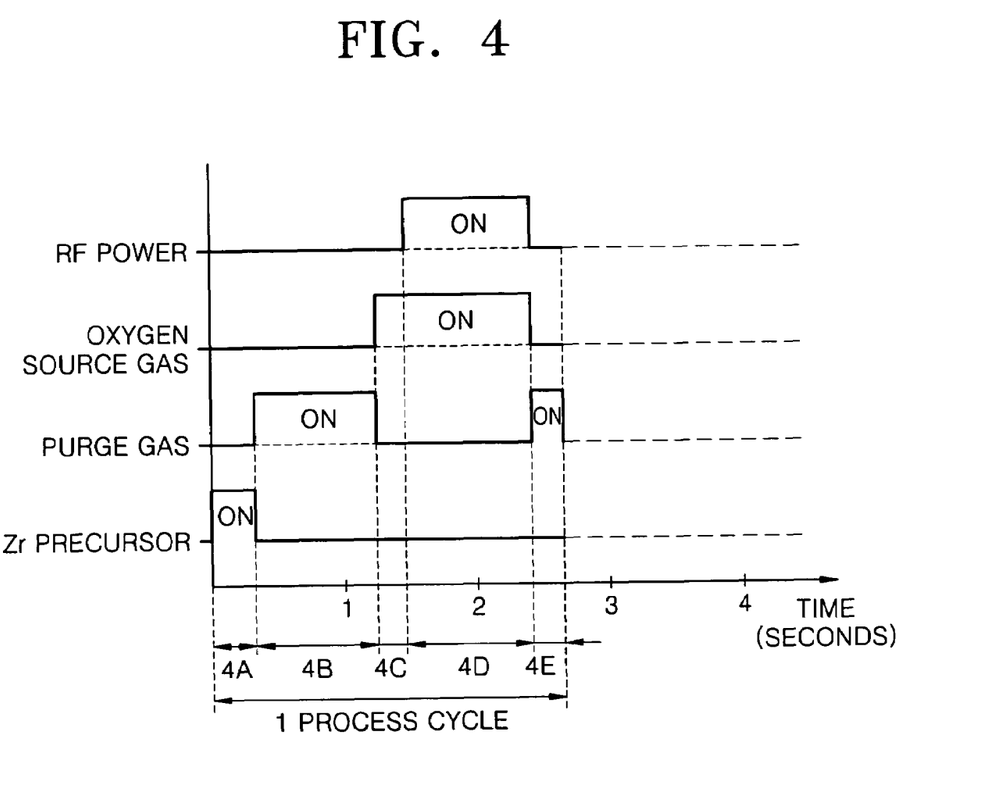
FIG. 4 is an example gas pulsing diagram illustrating one PEALD process cycle employed in a method of forming a $ZrO_2$ thin film according to example embodiments of the present invention.

FIG. 4 is an example of a gas pulsing diagram illustrating one PEALD process cycle performed inside a reaction chamber in a method of forming a $ZrO_2$ thin film by the PEALD process as illustrated in FIG. 3 according to example embodiments of the present invention To form the $ZrO_2$ thin film by a PEALD process in accordance with the cycle illustrated in FIG. 4, a Zr oxide precursor may use NOZ-31 and may use an oxygen source gas that is at least one selected from $O_2$, $N_2O$, $O_3$ and/or any other suitable oxygen source gas. At least one gas selected from $NH_3$, $N_2$ and/or any other suitable gas may be supplied along with the oxygen source gas to control the oxidation by the oxygen source gas.

In FIG. 3 at 10, a substrate having the $ZrO_2$ thin film may be loaded into a reaction chamber to perform a PEALD process. The substrate inside the reaction chamber may maintain a desired temperature at about 100° C.-about 550° C., and the inside of the reaction chamber may maintain a desired pressure at about 0.1 torr-about 10 torr.

At 20, a Zr oxide precursor may be supplied to the substrate. NOZ-31 may be supplied as the Zr oxide precursor. If the Zr oxide precursor is supplied to the substrate, a chemisorption layer and a physisorption layer of the Zr oxide precursor may be formed on the substrate (step 4A of FIG. 4).

At 30, a purge gas may be supplied into the reaction chamber to remove the physisorption layer from the substrate and discharge it out of the reaction chamber (step 4B of FIG. 4). The purge gas may use an inert gas (e.g., Ar gas and/or any other suitable inert gas).

At 40, an oxygen source gas may be supplied into the reaction chamber, and the chemisorption layer of the Zr oxide precursor may remain on the substrate, thereby generating an oxidation atmosphere inside the reaction chamber (step 4C of FIG. 4). The oxygen source gas may be at least one gas selected from $O_2$, $N_2O$, $O_3$ and any other suitable gas. If necessary, at least one gas selected from $NH_3$, $N_2$ gases and/or any other suitable gas may be supplied together with the oxygen source gas in order to control oxidation by the oxygen source gas.

At 50, an RF power may be applied to the reaction chamber for a desired time while the inside of the reaction chamber is maintained with the oxidation atmosphere, thereby generating plasma of the ambient gas inside the reaction chamber (step 4D of FIG. 4). While the inside of the reaction chamber is maintained with the plasma atmosphere, the Zr oxide precursor, which was chemically adsorbed on the substrate, may react with radicals or ions of the ambient gas, and may be oxidized, thereby forming a first atomic layer of the $ZrO_2$ thin film on the substrate.

The RF power for generating the plasma may be about 50 W-about 1000 W, for example, about 100 W-about 400 W. The time for RF power 'ON' may be about 0.1-about 10 seconds.

At 60, a purge gas may be supplied into the reaction chamber in the OFF state of RF power to discharge unnecessary materials (e.g., non-reacted residues, radicals, and/or the like) out of the chamber (step 4E of FIG. 4).

At 70, it will be determined if the $ZrO_2$ thin film is formed with a desired thickness on the substrate. Steps 20-60 may be repeated until the $ZrO_2$ thin film on the substrate has a desired thickness (1 process cycle of FIG. 4).

In example embodiments of the present invention, the time taken to perform the one process cycle of FIG. 4 may be about 10-about 50 seconds. While steps 20-60 are performed, the inside of the reaction chamber may be maintained at a temperature of about 100° C.-about 550° C., for example, about 270° C.-about 330° C.

Figure 5A:
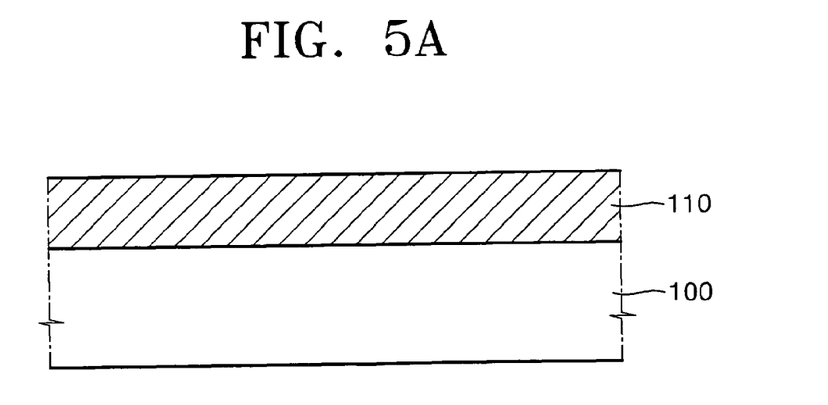
FIGS. 5A-5C are diagrams illustrating a method of forming a $ZrO_2$ thin film, according to example embodiments of the present invention, in accordance with processing sequences.
Figure 5B:
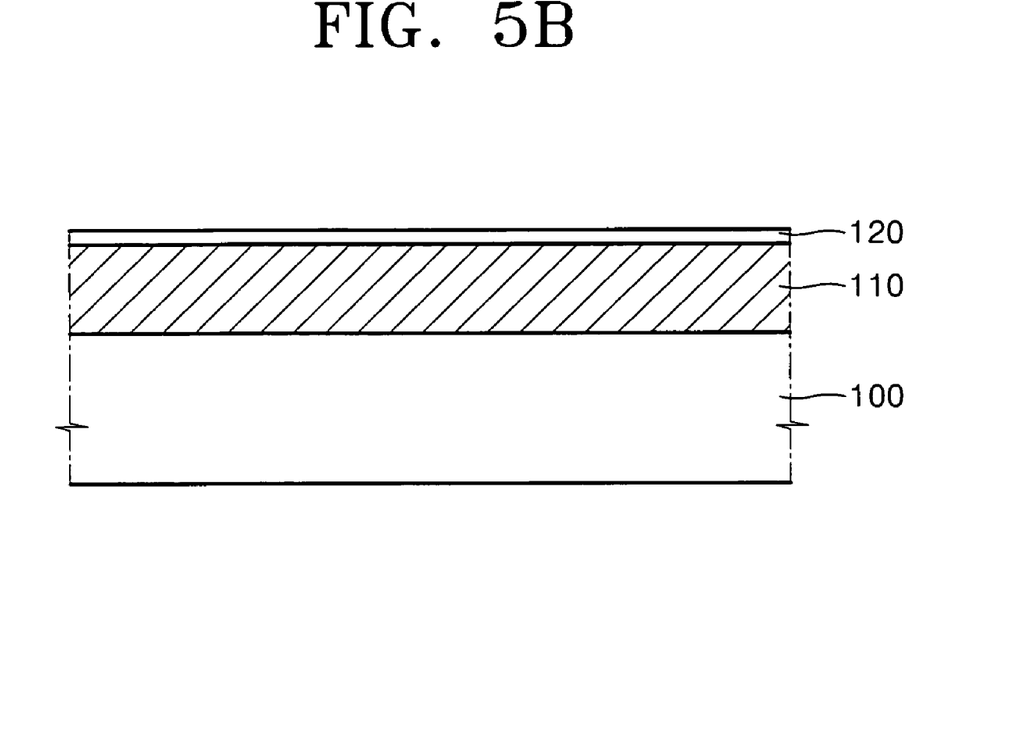
Figure 5C:
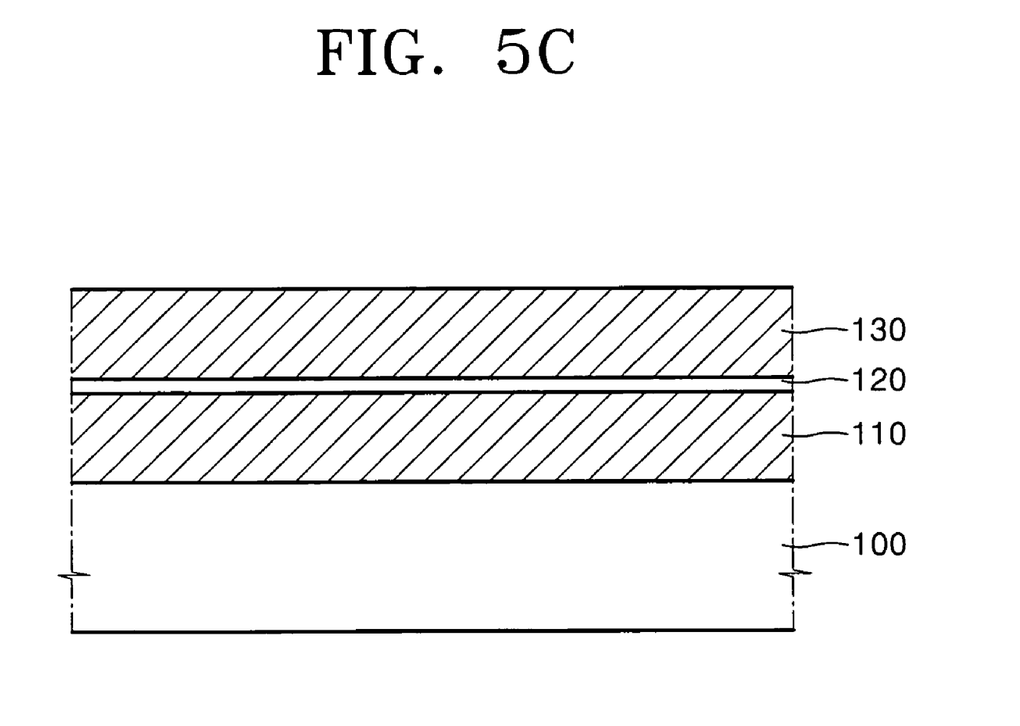

FIGS. 5A-5C are diagrams illustrating a method of fabricating a capacitor of a semiconductor memory device, according to example embodiments of the present invention, in accordance with processing sequences.

Referring to FIG. 5A, a conductive material may be deposited on the semiconductor substrate 100, thereby forming a lower electrode 110. The lower electrode 110 may be composed of a metal nitride and/or a noble metal (e.g., TiN, TaN, WN, Ru, Ir, Pt and/or any other suitable metal). The lower electrode 110 may be formed by ALD, chemical vapor deposition (CVD), metal-organic CVD (MOCVD), and/or physical vapor deposition (PVD) methods.

Referring to FIG. 5B, a dielectric layer 120 may be formed on the lower electrode 110. The dielectric layer 120 may include the $ZrO_2$ thin film. The dielectric layer 120 may be formed using PEALD, ALD, CVD methods and/or any other suitable method. If the $ZrO_2$ thin film of the dielectric layer 120 is formed using a PEALD process, it may be formed by the process cycle shown in FIG. 4. At this time, NOZ-31 having a structure shown in Formula 1 may be used as a Zr oxide precursor to form the $ZrO_2$ thin film. An oxygen source gas may be, for example, $O_2$, $N_2O$, $O_3$ gas and/or any other suitable gas. If necessary, at least one gas, for example, $NH_3$, $N_2$ gas and/or any other suitable gas, may be supplied together with the oxygen source gas in order to control oxidation by the oxygen source gas.

The $ZrO_2$ thin film of the dielectric layer 120 may be formed using an ALD process and/or any other suitable process. NOZ-31, having a structure shown in Formula 1, may be used as a Zr oxide precursor to form the $ZrO_2$ thin film. At least one gas, for example, $H_2O$, $O_3$, $NH_3$, $N_2$, $O_2$, $N_2O$, $H_2O_2$ and/or any other suitable gas, may be used as a reactant gas to react with the Zr oxide precursor. The dielectric layer 120 may be formed of a single layer composed of the $ZrO_2$ thin film. The dielectric layer 120 may also be formed of a double layer or triple layer composed of the $ZrO_2$ thin film, and at least one layer selected from an $Al_2O_3$ thin film and/or a $HfO_2$ thin film, which are sequentially stacked. For example, the dielectric layer 120 may be composed of a stack structure of $Al_2O_3/ZrO_2$, $ZrO_2/Al_2O_3$, $ZrO_2/Al_2O_3/ZrO_2$, $ZrO_2/Al_2O_3/ZrO_2/Al_2O_3$, $HfO_2/ZrO_2$, $ZrO_2/HfO_2$, $ZrO_2/HfO_2/ZrO_2$ and/or the like. The dielectric layer 120 may be composed of a $ZrO_2$ thin film and an $Al_2O_3$ thin film, and/or a $ZrO_2$ thin film and a $HfO_2$ thin film, by alternately stacking about 1-3 atomic layers (e.g., a $Zr_xAl_yO_z$ thin film, and/or a $Zr_xHf_yO_z$ thin film). The $Al_2O_3$ thin film and/or the $HfO_2$ thin film of the dielectric layer 120 may be formed using PEALD and/or ALD methods.

Figure 6:
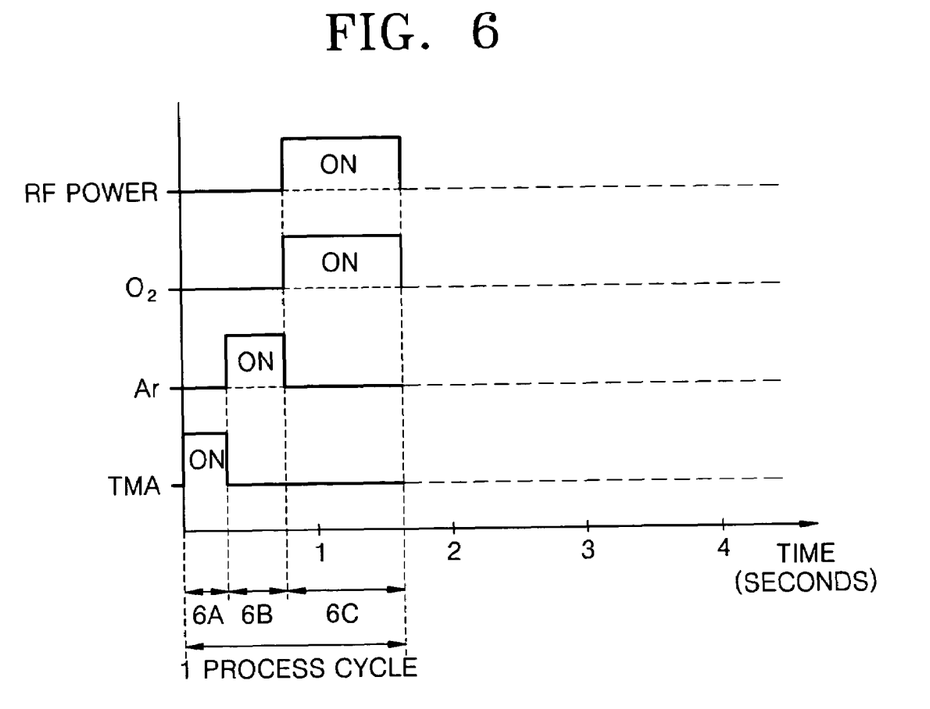
FIG. 6 is an example gas pulsing diagram illustrating one PEALD process cycle for forming an $Al_2O_3$ thin film employed in a method of fabricating a capacitor of a semiconductor memory device according to example embodiments of the present invention.

FIG. 6 illustrates a gas pulsing diagram of one cycle of a PEALD process for forming an $Al_2O_3$ thin film, employed to form the dielectric layer 120. In FIG. 6, a gas pulsing diagram for one cycle of a PEALD process illustrates trimethylaluminum (TMA), used as a source for Al, $O_2$ gas, used as a reactant gas with TMA and Ar, used as a purge gas. A step 6A may be performed for about 0.2 seconds, a step 6B may be performed for about 0.4 seconds, and a step of 6C may be performed for about 1 second in FIG. 6.

Figure 7:
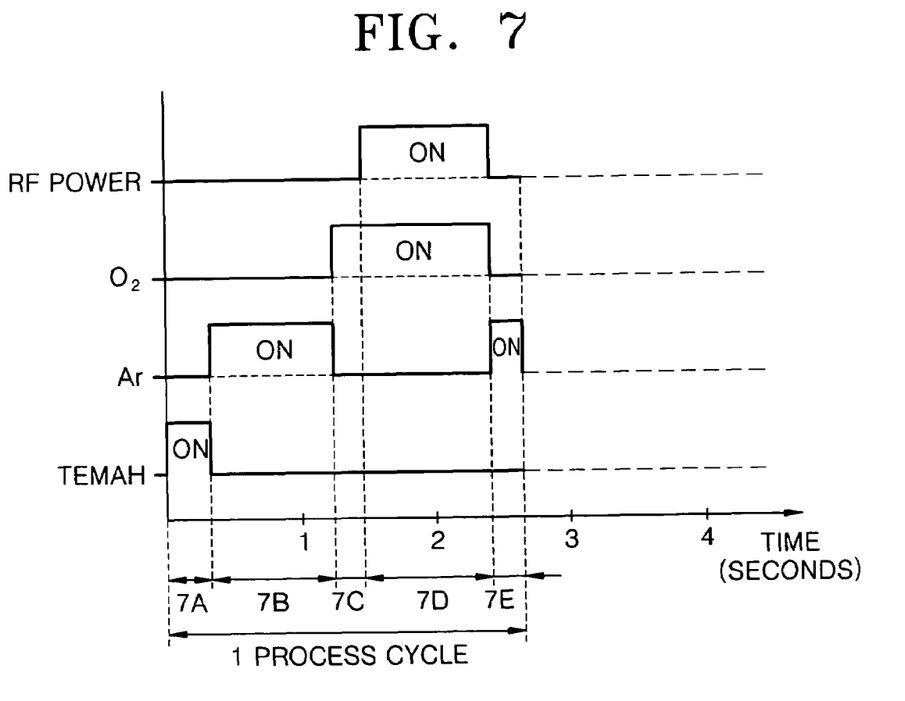
FIG. 7 is an example gas pulsing diagram illustrating one process cycle of PEALD for forming a $HfO_2$ thin film employed in a method of fabricating a capacitor of a semiconductor memory device according to example embodiments of the present invention.

FIG. 7 is an example gas pulsing diagram illustrating one PEALD process cycle for forming a $HfO_2$ thin film, employed to form the dielectric layer 120. A gas pulsing diagram for one PEALD process cycle, employed to form a $HfO_2$ thin film, may be necessary to form the dielectric layer 120 in FIG. 7. In FIG. 7, a gas pulsing diagram for one process cycle of a PEALD process illustrates tetrakis(ethylmethylamino) hafnium (TEMAH), used as a source for Hf, $O_2$ gas, used as a reactant gas with TAMAH and Ar, used as a purge gas. Step 7A may be performed for about 0.3 seconds, step 7B may be performed for about 1 second, step 7C may be performed for about 0.2 seconds, step 7D may be performed for about 1 second and step 7E may be performed for about 0.2 seconds in FIG. 7.

In the TEALD process illustrated in FIGS. 6 and 7, TMA, TEMAH, $O_2$ gas and/or the like may be used as a source gas and/or a reactant gas, but example embodiments of the present invention are not limited to this. It will be well understood to those skilled in this art that examples of various modifications using various source gases and oxygen-containing reactant gases, which are well known in this field, can be employed to example embodiments of the present invention.

After the dielectric layer 120 is formed, a thermal process and/or a plasma treatment process may be performed to crystallize the dielectric layer 120, if necessary. The thermal process and/or the plasma treatment process may be performed at a relatively low temperature of about 250° C.-450° C., for example, about 350° C.-450° C. The thermal process and/or the plasma treatment process for crystallizing the dielectric layer 120 may be performed in the atmosphere of a nitrogen-containing gas including $NH_3$, $N_2O$, $N_2$ and/or any other suitable gas.

Referring to FIG. 5C, an upper electrode 130 may be formed on the dielectric layer 120. The upper electrode 130 may be composed of a metal nitride and/or a noble metal (e.g., TiN, TaN, WN, Ru, Ir, Pt and/or any other suitable element). The upper electrode 130 may be formed using ALD, CVD, MOCVD, and/or PVD methods.

Figure 8:
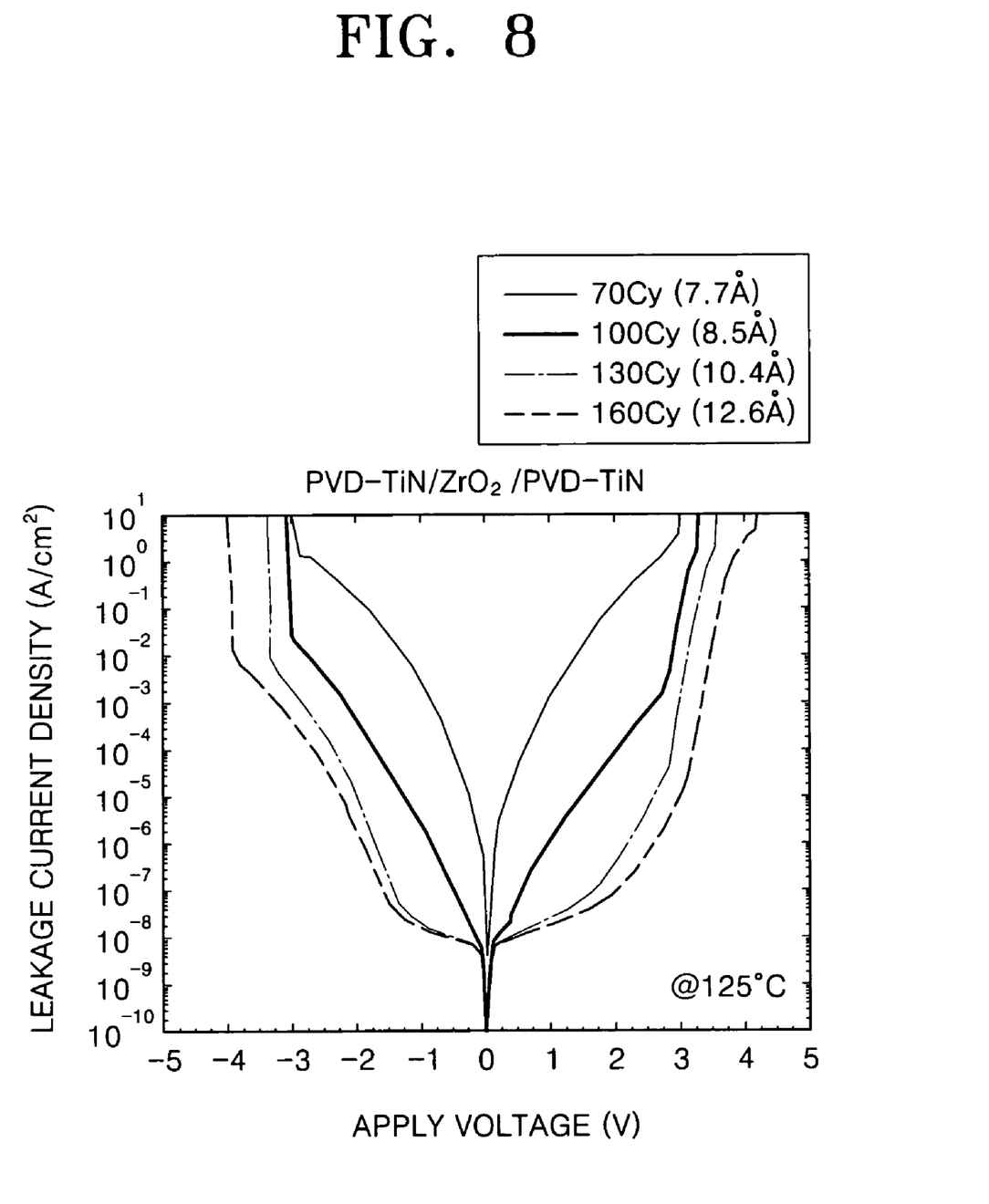
FIG. 8 is a graph illustrating analysis results of leakage current characteristics in accordance with the number of deposition cycles of a $ZrO_2$ thin film formed by a PEALD method according to example embodiments of the present invention.

FIG. 8 is a graph illustrating analysis results of leakage current characteristics, in accordance with the number of deposition cycles (thin film thickness), of a $ZrO_2$ thin film, formed by a PEALD method according to example embodiments of the present invention.

For analysis of FIG. 8, a lower electrode of a planar structure may be formed of a TiN layer using a PVD method and/or any other suitable method. A dielectric layer, being composed of a $ZrO_2$ thin film, may be formed on the lower electrode using a PEALD process and/or any other suitable process. An upper electrode, composed of a TiN layer, may be formed on the dielectric layer using a PVD method and/or any other suitable method. In each deposition cycle of the PEALD process illustrated in FIG. 4 in order to form the dielectric layer, the time for the one cycle is set to take about 2.7 seconds when performing step 4A for about 0.3 seconds, step 4B for about 1 second, step 4C for about 0.2 seconds, step 4D for about 1 second, and step 4E for about 0.2 seconds. In the steps of 4C and 4D, $O_2$, as an oxygen source gas, may be supplied at a flow rate of about 230 sccm, and in step 4D, about 600 W of RF power is applied. The deposition of the $ZrO_2$ thin film may be maintained at a temperature of about 125° C.

FIG. 8 illustrates thickness of an equivalent oxide layer (EOT) of the $ZrO_2$ thin films achieved after performing the PEALD process cycle 70, 100, 130, and 160 times, respectively. A takeoff voltage (Vtoff) at 100 $nA/cm^2$ for 130 cycles (EOT=10.4°) is about 1.6 V, but a Vtoff for 100 cycles (EOT=8.5°) is about 0.6 V, which may be rapidly deteriorated. Further, a Vtoff for 160 cycles (EOT=12.6 Å) is about 2.0 V. A leakage current characteristic of $HfO_2$ thin film may rapidly deteriorate from about 12 Å or lower. The $ZrO_2$ thin film may be formed by the method, according to example embodiments of the present invention, which may cause rapid deterioration from the EOT of about 9 Å-about 10 Å, and scaling-down may be possible at about 2 Å-about 3 Å of EOT, as compared to the $HfO_2$ thin film.

Because the crystallization of the $ZrO_2$ thin film is varied in accordance with a deposition temperature, the electrical characteristics and/or the layer characteristics may be important factors in selecting an improved deposition temperature. The deposition temperature may be about 100° C.-about 550° C., or, for example, about 270° C.-about 330° C.

Figure 9:
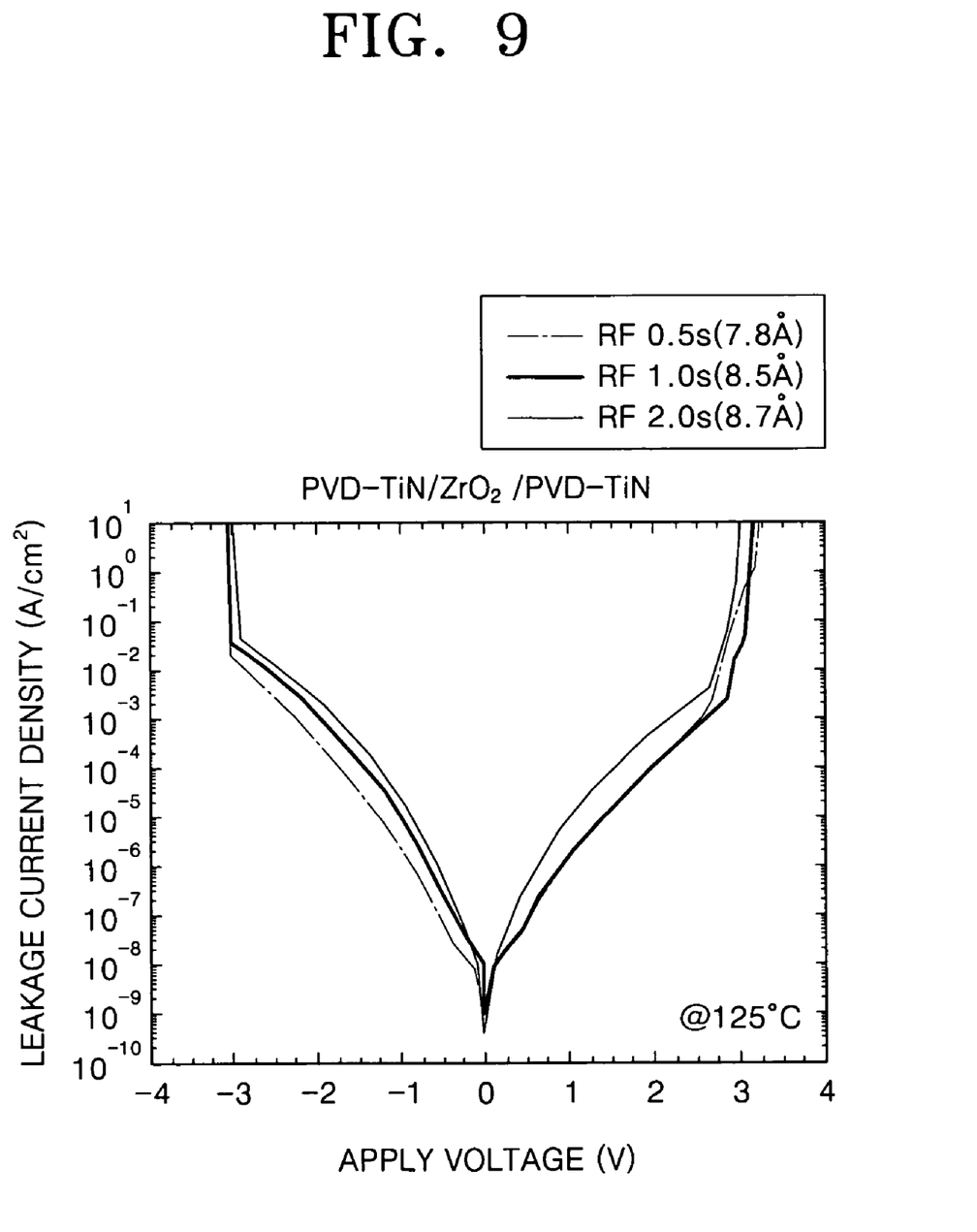
FIG. 9 is a graph illustrating analysis results of leakage current characteristics in accordance with the RF power apply time of a $ZrO_2$ thin film formed by a PEALD method according to example embodiments of the present invention.

FIG. 9 is a graph illustrating leakage current characteristics, in accordance with RF power apply time of a $ZrO_2$ thin film, formed by a PEALD method according to example embodiments of the present invention.

For FIG. 9, a sample may be fabricated under the same conditions as the conditions employed for the analysis of FIG. 8. FIG. 9 illustrates the EOT of the $ZrO_2$ thin film that may be formed by performing the PEALD process cycle of FIG. 4 about 100 times with RF power applied for about 0.5 seconds, about 1.0 second, and about 2.0 seconds, respectively. In FIG. 9, even though the time of applied RF power may be reduced down to about 0.5 seconds, leakage current characteristics may be almost the same. As the time of applied RF power is reduced, EOT may be reduced. The EOT may be reduced and concurrently, the process time for forming the $ZrO_2$ thin film may be shortened.

Figure 10:
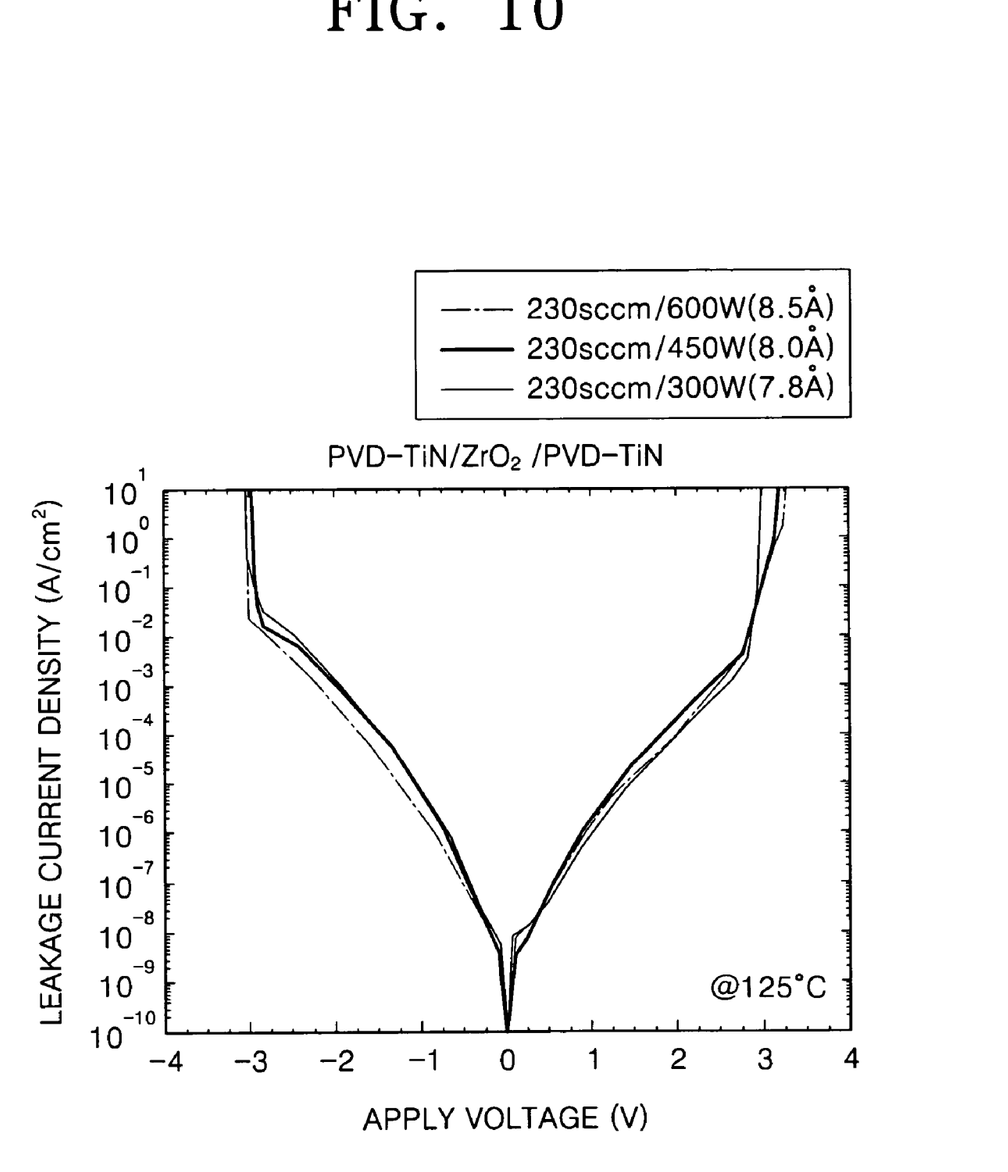
FIG. 10 is a graph illustrating analysis results of leakage current characteristics in accordance with RF power when a flow rate of oxygen ($O_2$) source gas in the steps of 4C and 4D of FIG. 4 is about 230 sccm according to example embodiments of the present invention.
Figure 11:
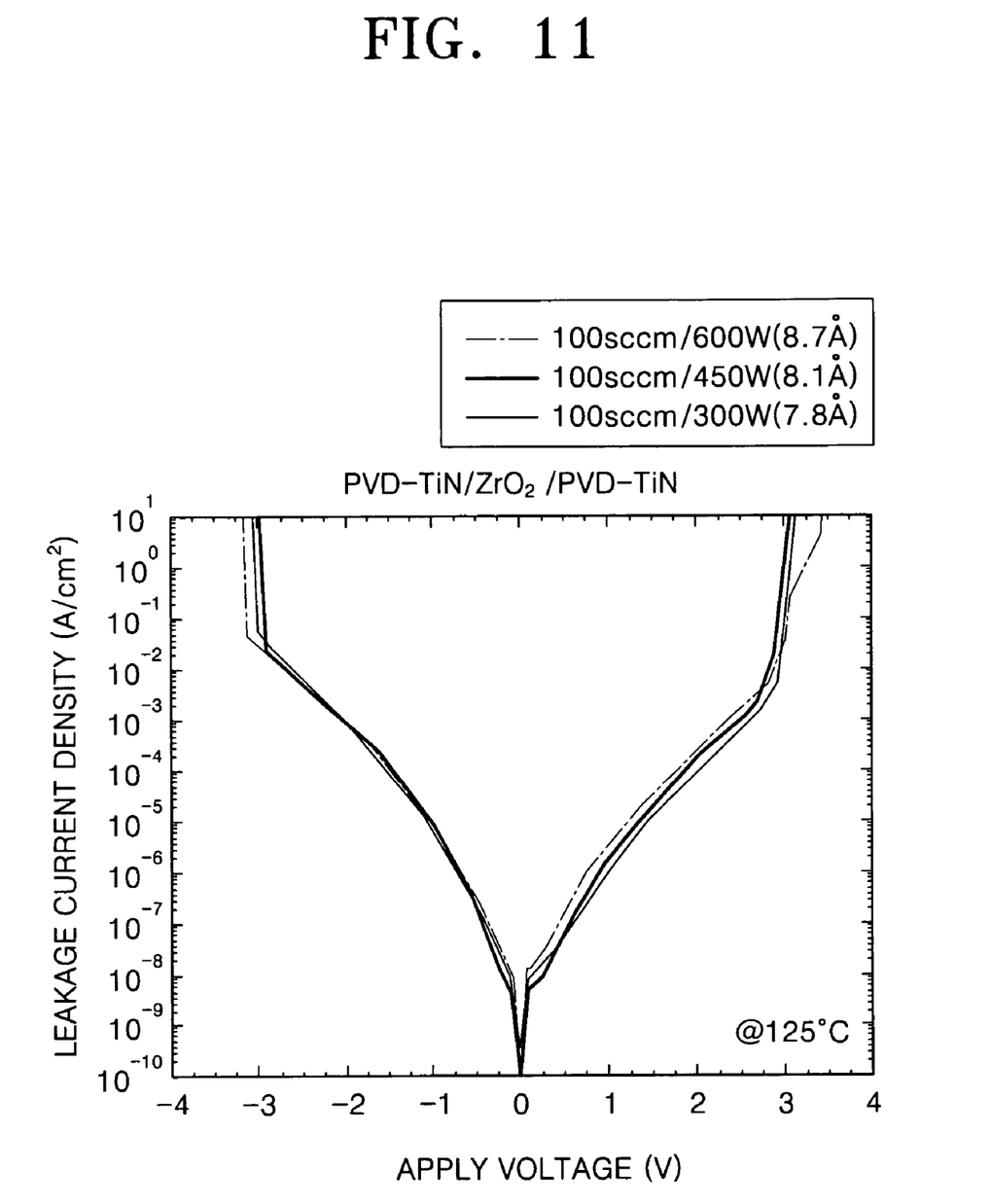
FIG. 11 is a graph illustrating analysis results of the leakage current characteristics in accordance with RF power when a flow rate of oxygen ($O_2$) source gas in the steps of 4C and 4D of FIG. 4 is about 100 sccm according to example embodiments of the present invention.

FIGS. 10 and 11 are graphs illustrating leakage current characteristics, in accordance with RF power, when flow rates of oxygen ($O_2$) source gas, in the steps of 4C and 4D of FIG. 4, are about 230 sccm and about 100 sccm, respectively.

For FIGS. 10 and 11, a sample may be fabricated under the same conditions as the conditions employed for the analysis of FIG. 8. The PEALD process cycle of FIG. 4 may be performed about 100 times. Applied RF power may be about 600 W, about 450 W, and about 300 W, respectively. FIGS. 10 and 11 illustrate EOTs of the $ZrO_2$ thin films that may be formed by applying values of the RF power, respectively.

In FIGS. 10 and 11, if the RF power is reduced to flow rates of $O_2$ gas at about 230 sccm (FIG. 10), and about 100 sccm (FIG. 11), respectively, the EOT may be reduced by about 0.7 Å-about 0.9 Å, but leakage current characteristics may be the same. The EOT and/or the leakage current characteristics may seldom change in a flow rate of $O_2$ gas. A relatively wide process window of the PEALD process may be achieved and stable process conditions may be ensured. RF power and its applied time are the main parameters of a plasma process. Improved conditions may vary, depending on the structure of a substrate. According to example embodiments of the present invention, when RF power deposits the $ZrO_2$ thin film using a PEALD process, it may be about 1000 W or less and the time of applied RF power may take about 10 seconds or less.

Figure 12:
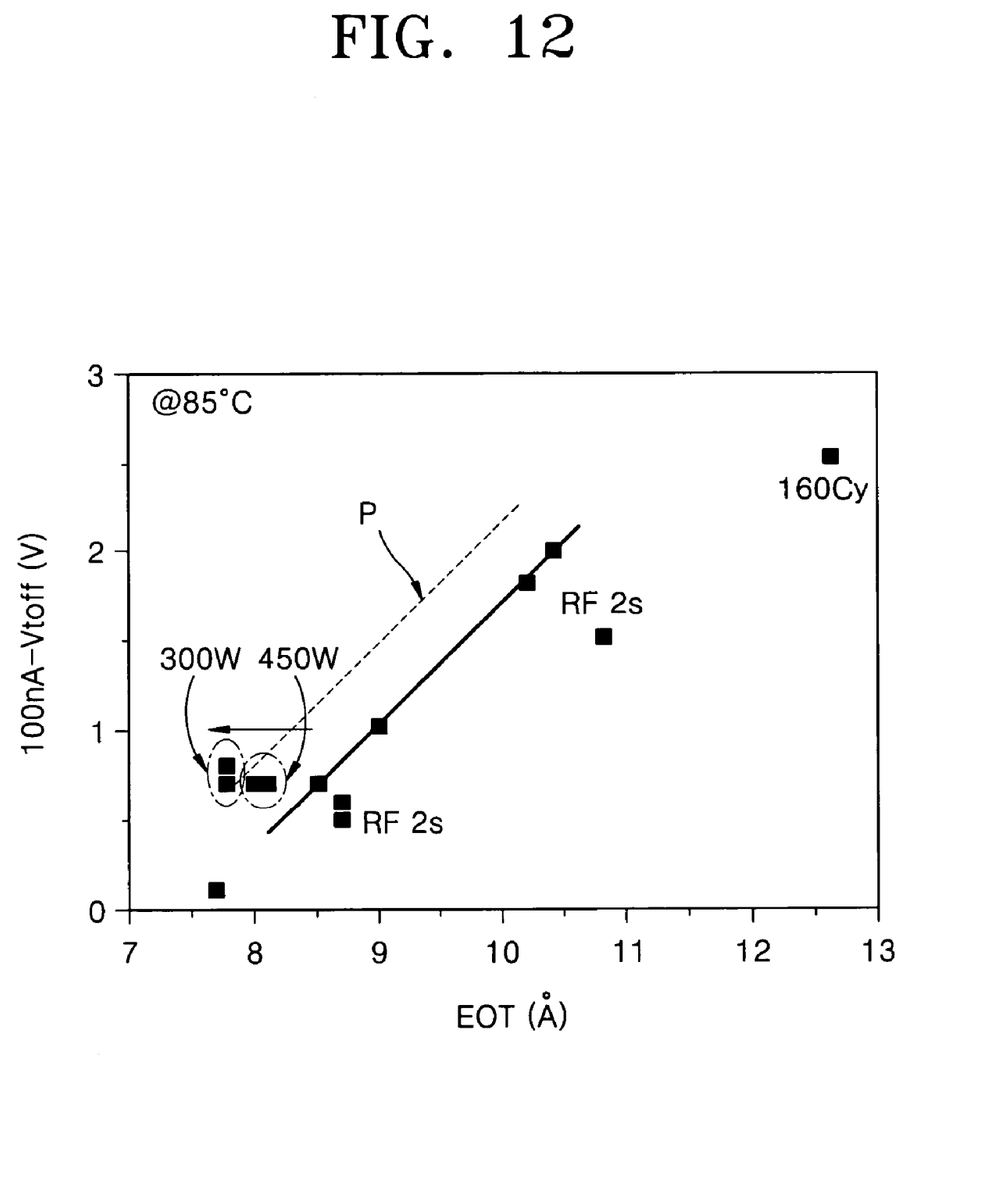
FIG. 12 is a graph illustrating change of takeoff voltage (Vtoff) at $100 nA/cm^2$ in accordance with change of EOT of a dielectric layer in the capacitor structure employing a $ZrO_2$ thin film formed in the fabrication method, according to example embodiments of the present invention as a dielectric layer.

FIG. 12 is a graph illustrating change of takeoff voltage (Vtoff) at 100 nA/cm² in accordance with change of EOT of a dielectric layer in the capacitor structure employing a $ZrO_2$ thin film formed in the method of fabricating a dielectric layer according to example embodiments of the present invention.

For FIG. 12, a sample may be fabricated under the same conditions as the conditions employed for FIG. 8, except that the deposition temperature may be about 85° C. RF power, the time for applied RF power, and the number of PEALD deposition cycles for forming a $ZrO_2$ thin film, are illustrated in FIG. 12. From the view of a trend line (line 'P') of FIG. 12, which may be achieved at about 85° C., and change of Vtoff at about 100 nA/cm², in accordance with EOT change, Vtoff may be about 1 V with about 9 Å. About 8.5 Å of EOT may be ensured by controlling RF power and RF time.

Figure 13:
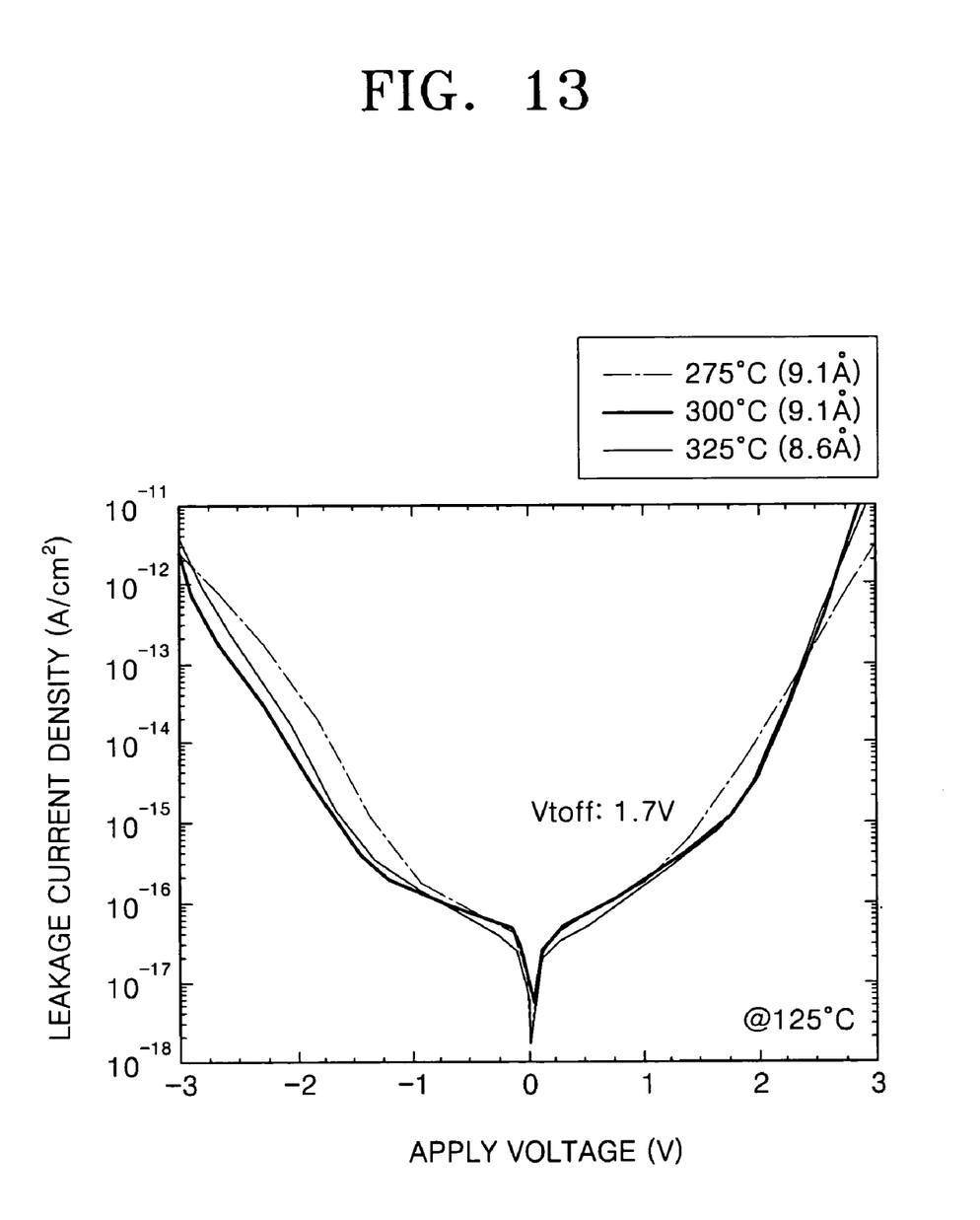
FIG. 13 is a graph illustrating analysis results of leakage current characteristics of a capacitor when a $ZrO_2$ thin film is formed on a main portion of a concave-type lower electrode by the method according to example embodiments of the present invention.

FIG. 13 is a graph illustrating leakage current characteristics of a capacitor when a $ZrO_2$ thin film is formed on a main portion of a concave-type lower electrode, having an aspect ratio of about 10:1 and a depth of about 9000 Å by the method according to example embodiments of the present invention. FIG. 13 illustrates leakage current characteristics fabricated under conditions similar to those of FIG. 8. For the analysis of FIG. 13, the PEALD process of forming the $ZrO_2$ thin film may be performed in about 120 cycles. Leakage current characteristics of the planar structure of the capacitor may be improved when the deposition temperature of the $ZrO_2$ thin film is about 275° C., about 300° C. and about 325° C., respectively. About 1.7 V of Vtoff may be ensured with about 8.5 Å-about 9 Å of EOT.

According to example embodiments of the present invention, a Zr oxide precursor of forming the $ZrO_2$ thin film may use a tris (N-ethyl-N-methylamino) (tert-butoxy) zirconium precursor having higher vapor pressure and/or thermal stability. Damage on the substrate, due to plasma, may be reduced (if not minimized), by reducing the period of applied RF power in the method of forming the $ZrO_2$ thin film using a PEALD process. The $ZrO_2$ thin film may have improved electrical characteristics by employing a higher deposition speed and/or a short deposition cycle time. The yield may be increased and productivity may be improved. When the $ZrO_2$ thin film is used for the dielectric layer of a capacitor of a semiconductor device, improved electrical characteristics may be possible by maintaining leakage current characteristics and increasing (if not maximizing) capacitance.

While example embodiments of the present invention have been particularly shown and described with reference to the example embodiments shown in the drawings, it will be understood by those of ordinary skill in the art that various changes in form and details may be made therein without departing from the spirit and scope of example embodiments of the present invention as defined by the following claims.

What is claimed is:

1. A method of forming a $ZrO_2$ thin film comprising:
   supplying a zirconium precursor on a substrate maintained at a desired temperature, thereby forming a chemisorption layer of the precursor on the substrate;
   exposing the substrate having the chemisorption layer of the precursor to the oxidation atmosphere without generation of plasma for a desired time; and then
   exposing the substrate having the chemisorption layer of the precursor to a plasma atmosphere of oxygen-containing gas for a desired time, thereby forming a Zr oxide layer on the substrate, wherein the zirconium precursor is a tris(N-ethyl-N-methylamino)(tert-butoxy)zirconium precursor.

2. The method according to claim 1, wherein the substrate is maintained at a temperature of about 100° C.-about 550° C., inclusive.

3. The method according to claim 1, wherein the substrate is exposed to the plasma atmosphere of the oxygen-containing gas for about 0.1-about 10 seconds, inclusive.

4. The method according to claim 1, wherein the oxygen-containing gas includes at least one gas selected from the group including $O_2$, $N_2O$ and $O_3$.

5. The method according to claim 1, wherein the oxygen-containing gas includes at least one oxygen source gas selected from the group including $O_2$, $N_2O$ and $O_3$, and includes at least one gas selected from the group including $NH_3$ and $N_2$.

6. The method according to claim 1, wherein the oxidation atmosphere includes at least one gas selected from the group including $O_2$, $N_2O$ and $O_3$.

7. The method according to claim 6, wherein the oxidation atmosphere further includes at least one gas selected from the group including $NH_3$ and $N_2$.

8. The method according to claim 1, wherein the operation of forming the chemisorption layer of the precursor and the operation of forming the Zr oxide layer are performed inside a reaction chamber, and about 50 through about 1000 W of RF power is applied to the reaction chamber to generate the plasma atmosphere of the oxygen-containing gas inside the reaction chamber.

9. The method according to claim 1, wherein the operation of forming the chemisorption layer of the precursor and the operation of forming the Zr oxide layer are repeatedly performed until the $ZrO_2$ thin film is formed on the substrate with a desired thickness.

10. A method of fabricating a capacitor of a semiconductor memory device comprising:

forming a lower electrode on a semiconductor substrate;

forming a dielectric layer including a $ZrO_2$ thin film according to claim 1 on the lower electrode using a plasma enhanced atomic layer deposition (PEALD) process; and forming an upper electrode on the dielectric layer.

11. The method according to claim 10, wherein the lower electrode is composed of a metal nitride or a noble metal.

12. The method according to claim 10, wherein the lower electrode is composed of TiN, TaN, WN, Ru, Ir or Pt.

13. The method according to claim 10, wherein the upper electrode is composed of a metal nitride or a noble metal.

14. The method according to claim 13, wherein the upper electrode is composed of TiN, TaN, WN, Ru, Ir or Pt.

15. The method according to claim 10, wherein the operation of forming the dielectric layer includes forming the $ZrO_2$ thin film on the semiconductor substrate, using a zirconium precursor.

16. The method according to claim 15, wherein the operation of forming the $ZrO_2$ thin film includes:

forming a chemisorption layer of the precursor on the semiconductor substrate while maintaining the semiconductor substrate at a desired temperature; and exposing the substrate having the chemisorption layer of the precursor to the plasma atmosphere of oxygen-containing gas for a desired time, thereby forming a Zr oxide layer on the substrate.

17. The method according to claim 10, wherein the dielectric layer is composed of a double layer or a triple layer, in which a $ZrO_2$ thin film, and at least one thin film of an $Al_2O_3$ thin film and a $HfO_2$ thin film are sequentially stacked.

18. The method according to claim 17, wherein the dielectric layer is composed of a stack structure including $Al_2O_3/ZrO_2$, $ZrO_2/Al_2O_3$, $ZrO_2/Al_2O_3/ZrO_2$, $ZrO_2/Al_2O_3/ZrO_2/Al_2O_3$, $HfO_2/ZrO_2$, $ZrO_2HfO_2$, or $ZrO_2/HfO_2/ZrO_2$.

19. The method according to claim 10, wherein the dielectric layer is composed of a layer structure, in which a $ZrO_2$ thin film and an $Al_2O_3$ thin film, or a $ZrO_2$ thin film and a $HfO_2$ thin film are alternately stacked by about 1-about 3 atomic layers.

20. The method according to claim 19, wherein the dielectric layer is composed of a $Zr_xAl_yO_z$ thin film, or $Zr_xHf_yO_z$ thin film.

* * * * *